United States Patent
Lin

(10) Patent No.: US 8,334,696 B2
(45) Date of Patent: Dec. 18, 2012

(54) METHOD FOR MAGNETIC RESONANCE IMAGING WITH PARALLEL AND LOCALIZED SPATIAL ENCODING MAGNETIC FIELDS

(75) Inventor: Fa-Hsuan Lin, Brookline, MA (US)

(73) Assignee: The General Hospital Corporation, Boston, MA (US)

( * ) Notice: Subject to any disclaimer, the term of this patent is extended or adjusted under 35 U.S.C. 154(b) by 126 days.

(21) Appl. No.: 12/753,555

(22) Filed: Apr. 2, 2010

(65) Prior Publication Data
US 2011/0241673 A1   Oct. 6, 2011

(51) Int. Cl.
*G01V 3/00* (2006.01)
(52) U.S. Cl. ..................................... 324/309
(58) Field of Classification Search .......... 324/300–322; 600/410–435
See application file for complete search history.

(56) References Cited

U.S. PATENT DOCUMENTS

| | | | |
|---|---|---|---|
| 5,311,134 A * | 5/1994 | Yamagata et al. | 324/318 |
| 5,325,060 A * | 6/1994 | Mansfield et al. | 324/322 |
| 6,519,343 B1 * | 2/2003 | Mansfield | 381/71.1 |
| 6,696,836 B2 * | 2/2004 | Kimmlingen | 324/309 |
| 7,030,611 B2 * | 4/2006 | Sakakura | 324/318 |
| 7,370,789 B2 * | 5/2008 | Ham | 324/318 |
| 7,411,395 B2 | 8/2008 | Hennig | |
| 7,755,358 B2 * | 7/2010 | Dietz et al. | 324/319 |
| 2009/0273345 A1 | 11/2009 | Ruhm | |

OTHER PUBLICATIONS

Buehrer, M., et al., Array Compression for MRI With Large Coil Arrays, Magnetic Resonance in Medicine 57:1131-1139, 2007.
Hennig, J., et al., Parallel Imaging in Non-Bijective, Curvilinear Magnetic Field Gradients: A Concept Study, Magn. Reson. Mater Phy. 21:5-14, 2008.

* cited by examiner

*Primary Examiner* — Dixomara Vargas
(74) *Attorney, Agent, or Firm* — Quarles & Brady, LLP

(57) ABSTRACT

A method for producing an image of a subject with a magnetic resonance imaging (MRI) system is provided. In particular, spatial encoding of signals received from the subject is performed by spatial encoding magnetic fields (SEMs) produced by driving a parallel array of local gradient coils with current weightings that define a mode of the coil array. A set of globally orthogonal modes are determined using a singular value decomposition and two modes that produce SEMs with desired magnetic field variance characteristics are selected for spatial encoding. The spatially encoding signals are received by a parallel array of radio frequency receiver coil elements in order to resolve ambiguities in spatial encoding caused by the SEMs. Images are subsequently reconstructed using, for example, an iterative time domain reconstruction method.

19 Claims, 4 Drawing Sheets

METHOD FOR MAGNETIC RESONANCE IMAGING WITH PARALLEL AND LOCALIZED SPATIAL ENCODING MAGNETIC FIELDS

STATEMENT REGARDING FEDERALLY SPONSORED RESEARCH

This invention was made with United States government support awarded by the following agency: National Institutes of Health, DA14178, HD040712, NS037462, RR14075, and EB007298. The United States government has certain rights in this invention.

BACKGROUND OF THE INVENTION

The field of the invention is systems and methods for magnetic resonance imaging ("MRI"). More particularly, the invention relates to systems and methods for parallel MRI data acquisition and image reconstruction.

MRI uses the nuclear magnetic resonance ("NMR") phenomenon to produce images. When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems. These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

Depending on the technique used, many MR scans currently require many minutes to acquire the necessary data used to produce medical images. The reduction of this scan time is an important consideration, since reduced scan time increases patient throughout, improves patient comfort, and improves image quality by reducing motion artifacts. Many different strategies have been developed to shorten the scan time.

One such strategy is referred to generally as "parallel MRI" ("pMRI"). Parallel MRI techniques use spatial information from arrays of radio frequency ("RF") receiver coils to substitute for the spatial encoding that would otherwise have to be obtained in a sequential fashion using RF pulses and magnetic field gradients, such as phase and frequency encoding gradients. Each of the spatially independent receiver coils of the array carries certain spatial information and has a different spatial sensitivity profile. This information is utilized in order to achieve a complete spatial encoding of the received MR signals, for example, by combining the simultaneously acquired data received from each of the separate coils. Parallel MRI techniques allow an undersampling of k-space, in general, by reducing the number of acquired phase-encoded k-space sampling lines, while keeping the maximal extent covered in k-space fixed. The combination of the separate MR signals produced by the separate receiver coils enables a reduction of the acquisition time required for an image, in comparison to a conventional k-space data acquisition, by a factor related to the number of the receiver coils. Thus the use of multiple receiver coils acts to multiply imaging speed, without increasing gradient switching rates or RF power.

Two categories of such parallel imaging techniques that have been developed and applied to in vivo imaging are so-called "image space methods" and "k-space methods." An exemplary image space method is known in the art as sensitivity encoding ("SENSE"), while an exemplary k-space method is known in the art as simultaneous acquisition of spatial harmonics ("SMASH"). With SENSE, the undersampled k-space data is first Fourier transformed to produce an aliased image from each coil, and then the aliased image signals are unfolded by a linear transformation of the superimposed pixel values. With SMASH, the omitted k-space lines are synthesized or reconstructed prior to Fourier transformation, by constructing a weighted combination of neighboring k-space lines acquired by the different receiver coils. SMASH requires that the spatial sensitivity of the coils be determined, and one way to do so is by "autocalibration" that entails the use of variable density k-space sampling.

Typically, MRI utilizes constant magnetic field gradients along three orthogonal directions in order to position encode MR signals. These constant gradients provide the benefit of uniform voxel size and signal intensities across the imaging field-of-view ("FOV"). The linear variability of the magnetic fields is often offset by considerations of gradient efficiency. For example, highly linear gradients require high voltages and currents that can lead to inefficient gradient systems. In addition, larger gradient systems limit the slew rate that can be achieved before detrimental effects such as peripheral nerve stimulation in patients occur.

Recently, a method for pMRI referred to as "PatLoc" was developed, in which a combination of surface gradient coils and an RF receiver coil array to improve gradient efficiency and reduce peripheral nerve stimulation effects in patients. Such a method is described, for example, by J. Hennig, et al., in "Parallel Imaging in Non-Bijective, Curvilinear Magnetic Field Gradients: A Concept Study," *Magn. Reson. Mater. Phy.*, 2008; 21:5-14. The PatLoc method is a generalization of non-Cartesian gradient encoding schemes, such as MR encephalography or inverse imaging methods, such as the inverse imaging method described by F. H. Lin, et al., in "Dynamic Magnetic Resonance Inverse Imaging of Human Brain Function," *Magn. Reson. Med.*, 2006; 56:787-802.

The imaging and reconstruction algorithm of the PatLoc method has been previously reported using two orthogonal sets of linearly combined gradients with circular symmetry, as described by G. Schultz, et al., in "Image Reconstruction from Ambiguous PatLoc-Encoded MR Data," *Proc. Intl. Soc. Magn. Reson. Med.*, 2008; 786. The reconstructed PatLoc images exhibit a reduced sensitivity at the center of the imaging field-of-view because encoding information is lacking from both the gradient system and the RF sensitivity.

It would therefore be desirable to provide a method for parallel magnetic resonance imaging using localized gradients to produce spatial encoding magnetic fields such that images acquired with the method have substantially uniform sensitivity throughout a desired imaging field-of-view.

SUMMARY OF THE INVENTION

The present invention overcomes the aforementioned drawbacks by providing a method for magnetic resonance imaging ("MRI") using parallel gradient coils to produce two or more sets of spatial encoding magnetic fields ("SEMs") that are utilized to position-encode (e.g., frequency-, phase-, slice-, and partition-encode) magnetic resonance signals. In particular, these sets of SEMs are determined using a singular value decomposition ("SVD") algorithm. Images acquired with this method have substantially uniform sensitivity throughout a desired imaging field-of-view ("FOV"). Rather than using two sets of polarity reversed gradients, SVD is utilized to reveal two significant combinations of the localized gradients. These two linear combinations are employed as the "frequency" and "phase" encoding gradients.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
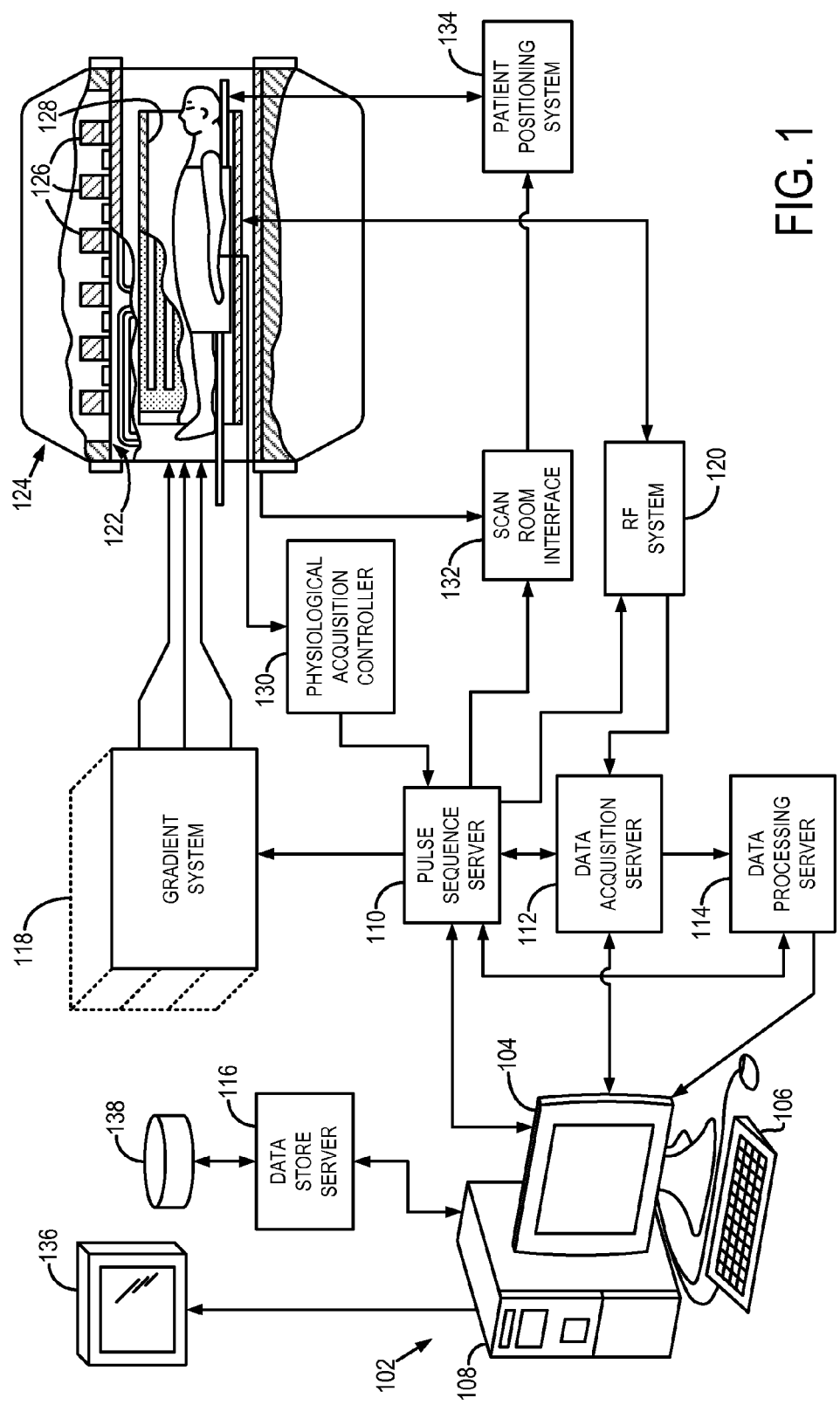
FIG. 1 is a block diagram of an exemplary magnetic resonance imaging ("MRI") system that employs the present invention.

Referring particularly to FIG. 1, the preferred embodiment of the invention is employed in a magnetic resonance imaging ("MRI") system. The MRI system includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system. The workstation 102 is coupled to four servers: a pulse sequence server 110; a data acquisition server 112; a data processing server 114, and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \qquad \text{Eqn. (1);}$$

and the phase of the received MR signal may also be determined:

$$\phi = \tan^{-1}\left(\frac{Q}{I}\right). \qquad \text{Eqn. (2)}$$

The pulse sequence server 110 also optionally receives patient data from a physiological acquisition controller 130.

The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. The data acquisition server 112 may also be employed to process MR signals used to detect the arrival of contrast agent in a magnetic resonance angiography ("MRA") scan. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 2:
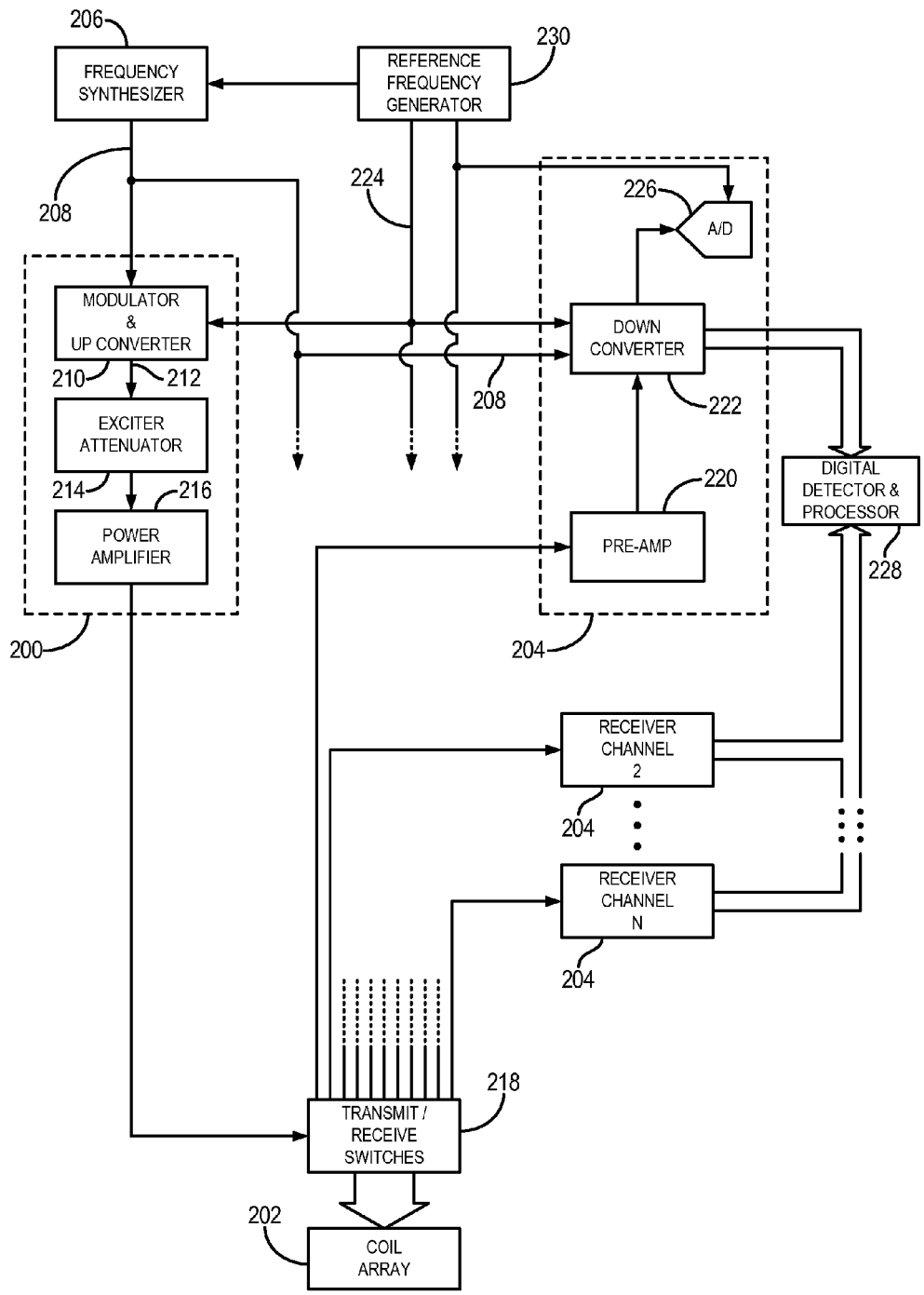
FIG. 2 is a block diagram of an exemplary radio frequency ("RF") system that forms a part of the MRI system of FIG. 1.

As shown in FIG. 1, the radiofrequency ("RF") system 120 may be connected to the whole body RF coil 128, or as shown in FIG. 2, a transmitter section of the RF system 120 may connect to at least one transmit channel 200 of a coil array 202, and its receiver section may connect to at least one receiver channel 204 of the coil array 202. Often, the transmitter section is connected to the whole body RF coil 128 or a local transmit coil (not shown), and, in so-called "parallel receiver" coil arrays, each receiver section is connected to a separate receiver channel 204.

Referring particularly to FIG. 2, the RF system 120 includes a transmitter that produces a prescribed RF excitation field. The base, or carrier, frequency of this RF excitation field is produced under control of a frequency synthesizer 206 that receives a set of digital signals from the pulse sequence server 110. These digital signals indicate the frequency and phase of the RF carrier signal produced at an output 208. The RF carrier is applied to a modulator and up converter 210 where its amplitude is modulated in response to a signal, R(t), also received from the pulse sequence server 110. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 212 is attenuated by an exciter attenuator circuit 214 that receives a digital command from the pulse sequence server 110. The attenuated RF excitation pulses are applied to a power amplifier 216, which drives the RF coil array 202 through a transmit/receive ("T/R") switch 218.

Referring still to FIG. 2, the signal produced by the subject is picked up by the coil array 202 and applied to the inputs of a set of receiver channels 204. A pre-amplifier 220 in each receiver channel 204 amplifies the signal by an amount determined by a digital attenuation signal received from the pulse sequence server 110. The received signal is at or around the Larmor frequency, and this high frequency signal is down-converted in a two step process by a down converter 222, which first mixes the detected signal with the carrier signal on line 208 and then mixes the resulting difference signal with a reference signal on line 224. The down converted MR signal is applied to the input of an analog-to-digital ("A/D") converter 226 that samples and digitizes the analog signal and applies it to a digital detector and signal processor 228 that produces 16-bit in-phase (I) values and 16-bit quadrature (Q) values corresponding to the received signal. The resulting stream of digitized I and Q values of the received signal are output to the data acquisition server 112. The reference signal, as well as the sampling signal applied to the A/D converter 226, are produced by a reference frequency generator 230.

MRI using localized gradients ("PatLoc") utilizes the combination of surface gradient coils and an RF receiver coil array. Different combinations of the current weightings applied to the gradient coil assembly, or array, are defined by different modes. Modes that when applied to a gradient coil assembly may generate a non-linearly, spatially varying magnetic field referred to as a spatial encoding magnetic field ("SEM") are calculated and selected. In general, when used for spatial encoding, such SEMs are inherently ambiguous because they produce a non-bijective correlation between k-space and the image domain. To resolve this ambiguity, a multiple receiver RF coil array is used for data acquisition. In general, the number of receiver elements in the RF coil array is equal to or greater than the degree of ambiguity present in the SEM.

In accordance with the present invention, a plurality of sets of spatial encoding magnetic fields ("SEMs") are utilized to spatially encode magnetic resonance signals. Each of these plurality of SEMs can be independently controlled. In particular, singular value decomposition ("SVD") is employed to determine a set of modes that are used to drive a gradient coil array to produce SEMs for the position encoding of MR signals. In particular, spatial encoding with such SEMs results in images that have a substantially uniform sensitivity over the imaging field-of-view ("FOV"), thereby limiting signal degradation. In turn, this improved spatial sensitivity results in the acquisition of images at a higher acceleration rate and having better quality than achievable with currently available PatLoc methods. By performing SVD, linear combinations of the SEMs that generate orthogonal fields with substantially optimal partitioning of the total variance inside the gradient fields are provided. For example, singular vectors having an accumulated singular value power that is higher than a pre-defined threshold, for example 90 percent of the total singular value power, are selected to determine the desired SEMs. In this example, each mode includes the sum of magnetic fields generated by each channel of the gradient coil assembly weighted by the corresponding entry of each selected singular vector. This result improves image reconstruction quality from both fully sampled and undersampled data.

Figure 3:
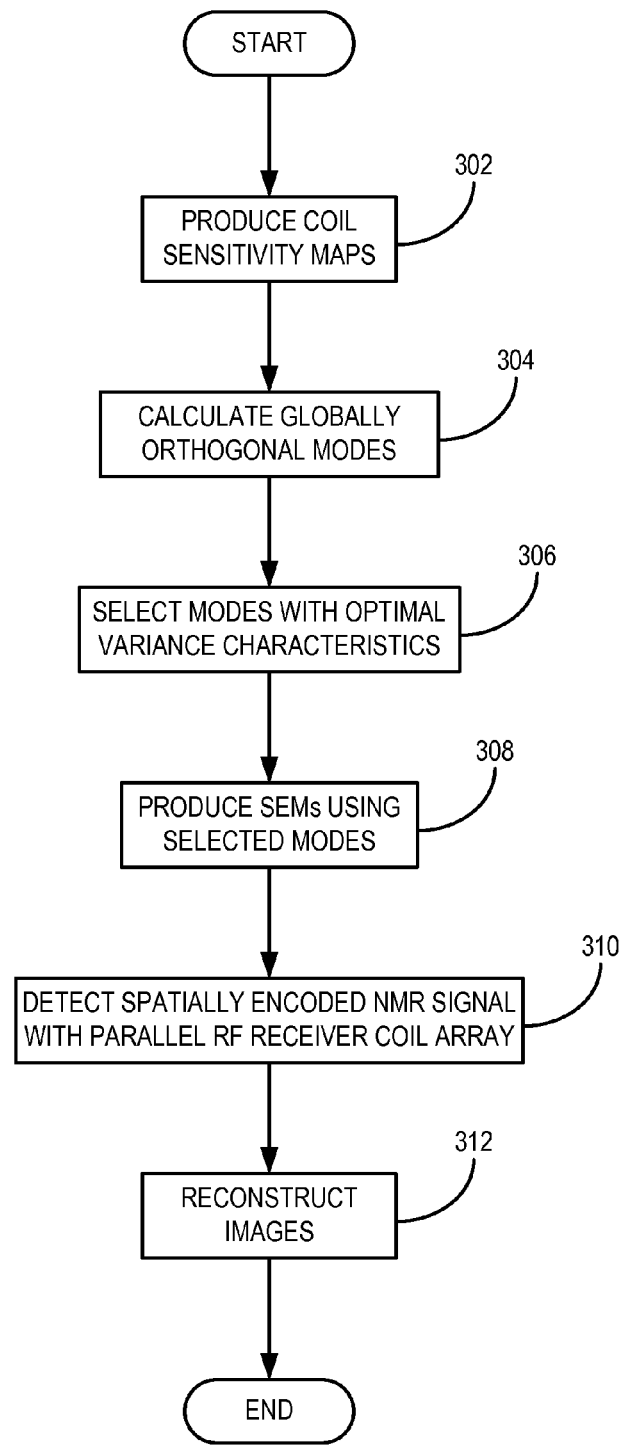
FIG. 3 is a flowchart setting forth the steps of an exemplary method for producing an image of a subject with an MRI system that employs parallel and localized spatial encoding magnetic field gradients in accordance with the present invention.

Referring now to FIG. 3, a flowchart setting forth the steps of an exemplary method for producing an image of a subject using spatial encoding magnetic fields to spatially encode signals received from the subject is illustrated. In particular, a singular value decomposition is employed to determine a set of globally orthogonal modes for driving a gradient coil assembly, such as a gradient coil array.

The method begins with the estimation of the spatial sensitivity of the gradient coil assembly used to produce the SEMs, as indicated at step 302. An SVD method is then performed to determine a set of globally orthogonal modes, as indicated at step 304. The set of globally orthogonal modes are calculated as follows. The desired modes are defined by combinations of current weightings applied to the gradient coils in the gradient coil assembly. In particular, for a gradient coil array used to obtain a magnetic resonance image having m pixels, and which includes n total gradient coil input channels, an m×n matrix, A, is formed. Each column of the matrix, A, represents the spatial distribution of the magnetic field generated by driving only the corresponding $n^{th}$ gradient coil in the array with unit current. Singular value decomposition it utilized to suggest, or determine, different "modes" corresponding to different SEMs. Each mode is described by fixed relative weightings applied to the gradient coil input channels.

Singular value decomposition of the matrix, A, results in:

$$A = USV \quad \text{Eqn. (3);}$$

where U is an m×n left singular vector matrix, S is an n X n singular value matrix, and V is an n×n right singular vector matrix.

Based on a pre-defined threshold, T, that describes the proportion of the total singular power to be included in the selected modes, the p most significant singular values and singular vectors are identified, as indicated at step 306, and as follows:

$$p = \underset{k}{\arg\min}\left[\left(\sum_{i=1}^{k} s_{ii}^2\right) \Big/ \left(\sum_{i=1}^{n} s_{ii}^2\right)\right] \geq T; \quad \text{Eqn. (4)}$$

where $s_{ii}$ is the $i^{th}$ singular value in the n X n singular value matrix, S.

The p significant gradient coil modes are subsequently calculated from the first p rows of the n×n right singular vector matrix, V. Each row suggests the relative driving current amplitude, or weighting, for each gradient coil input channel. In this manner, each row of the matrix V corresponds to one mode.

At least two of the modes are selected based on their variance characteristics. For example, more than two modes can be selected to be controlled by the same gradient time table in order to achieve frequency encoding, phase encoding, partition encoding, or slice selection.

Figure 4:
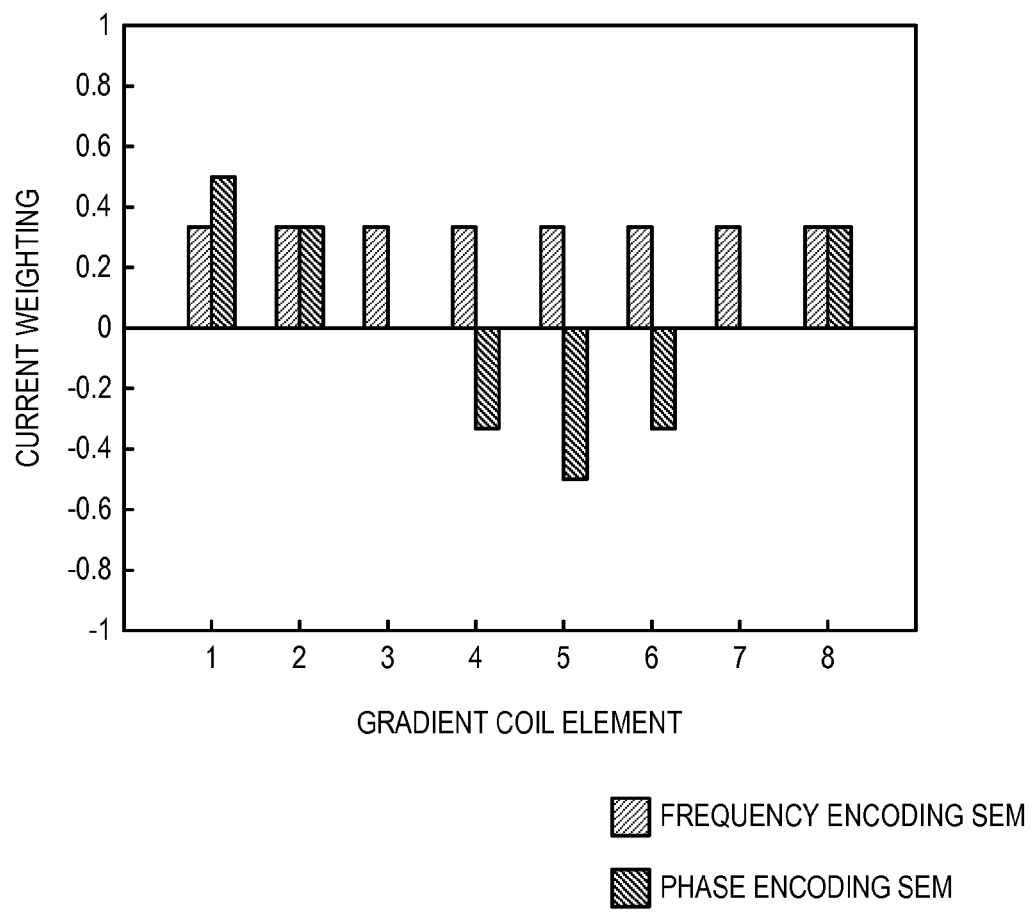
FIG. 4 is a plot illustrating two exemplary modes for driving a plurality of gradient coils to produce spatial encoding magnetic fields for frequency and phase encoding of a magnetic resonance signal in accordance with the present invention.

By way of example, the two modes include one substantially homogeneous mode and one substantially vertically linear mode. These two modes individually take 48 percent and 25 percent of total variance of the magnetic fields generated by the 8-channel gradient coil assembly. The coil weightings corresponding to these two exemplary modes are illustrated in FIG. 4.

The selected modes are then utilized to drive a gradient coil assembly in an MRI system in order to produce two different SEMs for spatially encoding NMR signals received from the subject, as indicated at step 308. These SEMs are utilized in common pulse sequences, such as traditional spin-echo-based pulse sequences. In general, one SEM is produced to replace traditional phase encoding gradients, and the other to replace traditional frequency encoding gradients. The spatially encoded NMR signal is then detected with a parallel RF receiver coil array, as indicated at step 310. As noted above, the parallel RF receiver coil array is utilized to resolve ambiguities that are present when using the SEMs for spatial encoding of NMR signals. An image of the subject is subsequently reconstructed using the acquired signal data, as indicated at step 312. An iterative time-domain reconstruction (iTDR) method, such as the one described by K. Pruessmann, et al., in "Advances in Sensitivity Encoding With Arbitrary k-Space Trajectories," *Magn. Reson. Med.*, 2001; 46:638-651, is employed for image reconstruction. Such a method is a generalization of the SENSE reconstruction with an arbitrary k-space trajectory, where the Fourier transform is replaced by explicit calculation of spin phase evolution along pulse sequence timing and the provided frequency and phase encoding gradient fields in the time domain.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject using a magnetic resonance imaging (MRI) system, the steps of the method comprising:
   a) determining at least two modes for driving a plurality of gradient coils that form a part of the MRI system in order to produce a respective at least two spatial encoding magnetic fields, each of the at least two modes describing a fixed relative weighting among the plurality of gradient coils;
   b) acquiring image data by directing the MRI system to perform a pulse sequence that includes applying a radio frequency (RF) excitation pulse and the at least two spatial encoding magnetic fields to the subject; and
   c) reconstructing an image of the subject from the acquired image data.

2. The method as recited in claim 1 in which step a) includes performing a singular value decomposition to determine the at least two modes.

3. The method as recited in claim 2 in which step a) further includes forming a matrix having a number of columns equal to a number of input channels of the plurality of gradient coils, and performing a singular value decomposition of the matrix.

4. The method as recited in claim 3 in which the singular value decomposition of the matrix produces a right singular value matrix having a number of columns equal to the number of input channels of the plurality of gradient coils, and the at least two modes are defined by at least first two rows of the right singular value matrix.

5. The method as recited in claim 2 in which a plurality of singular values are calculated by performing the singular value decomposition, and step a) further includes selecting at least two substantially most significant ones of the plurality of calculated singular values.

6. The method as recited in claim 2 in which the at least two modes are globally orthogonal.

7. The method as recited in claim 6 in which the at least two modes are not locally orthogonal.

8. The method as recited in claim 1 in which the at least two spatial encoding magnetic fields includes two spatial encoding magnetic fields that are applied to the subject in order to spatially encode magnetic resonance signals along two different directions.

9. The method as recited in claim 8 in which the two different directions correspond to a frequency encoding direction and a phase encoding direction.

10. The method as recited in claim 8 in which the three different directions correspond to a frequency encoding direction, a phase encoding direction, and at least one of a slice encoding direction and a partition encoding direction.

11. The method as recited in claim 1 in which the at least two spatial encoding magnetic fields includes three spatial encoding magnetic fields that are applied to the subject in order to spatially encode magnetic resonance signals along three different directions.

12. The method as recited in claim 1 in which the at least two spatial encoding magnetic fields include nonlinear magnetic field gradients.

13. A method for directing a magnetic resonance imaging (MRI) system to produce and spatially encode a nuclear magnetic resonance (NMR) signal, the steps of the method comprising:
   a) calculating at least two globally orthogonal modes for directing a gradient coil assembly that forms a part of the MRI system to produce a spatial encoding magnetic field;
   b) directing the MRI system to perform a pulse sequence that includes:
      i) producing a radio frequency (RF) field in order to produce transverse magnetization in a subject such that an NMR signal is produced as the transverse magnetization relaxes;
      ii) producing a first spatial encoding magnetic field using one of the at least two globally orthogonal modes and the gradient coil assembly so that the NMR signal produced in response to the RF field is spatially encoding along a first spatial direction;
      iii) producing a second spatial encoding magnetic field using one of the at least two globally orthogonal modes and the gradient coil assembly so that the NMR signal produced in response to the RF field is spatially encoding along a second spatial direction; and
   c) acquiring the spatially encoded NMR signal using an RF receiver coil array that includes multiple receiver elements.

14. The method as recited in claim 13 in which at least one of the first and second spatial encoding magnetic fields includes a non-linearly varying magnetic field gradient.

15. The method as recited in claim 13 in which the at least two globally orthogonal modes are not locally orthogonal.

16. The method as recited in claim 13 in which step a) includes performing a singular value decomposition to determine the at least two globally orthogonal modes.

17. The method as recited in claim 16 in which step a) further includes forming a matrix having a number of columns equal to a number of input channels of the plurality of gradient coils, and performing the singular value decomposition on the matrix.

18. The method as recited in claim 17 in which the singular value decomposition of the matrix produces a right singular value matrix having a number of columns equal to the number of input channels of the plurality of gradient coils, and the at least two globally orthogonal modes are defined by at least first two rows of the right singular value matrix.

19. The method as recited in claim 16 in which a plurality of singular values are calculated by performing the singular value decomposition, and step a) further includes selecting at least two substantially most significant ones of the plurality of calculated singular values.

* * * * *